United States Patent
Wang et al.

(10) Patent No.: US 9,466,324 B2
(45) Date of Patent: Oct. 11, 2016

(54) BIT PATTERNED MEDIA TEMPLATE INCLUDING ALIGNMENT MARK AND METHOD OF USING SAME

(71) Applicant: SEAGATE TECHNOLOGY LLC, Cupertino, CA (US)

(72) Inventors: HongYing Wang, Fremont, CA (US); Kim Y Lee, Fremont, CA (US); Yautzong Hsu, Fremont, CA (US); Nobuo Kurataka, San Jose, CA (US); Gennady Gauzner, San Jose, CA (US); Shuaigang Xiao, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 427 days.

(21) Appl. No.: 14/068,050

(22) Filed: Oct. 31, 2013

(65) Prior Publication Data

US 2015/0116690 A1   Apr. 30, 2015

(51) Int. Cl.
*G11B 5/855* (2006.01)
*G03F 9/00* (2006.01)
*G03F 7/00* (2006.01)

(52) U.S. Cl.
CPC ............. *G11B 5/855* (2013.01); *G03F 7/0002* (2013.01); *G03F 9/7042* (2013.01); *G03F 9/7076* (2013.01)

(58) Field of Classification Search
CPC .. G03F 7/2051; G03F 7/2059; G03F 9/7042; G03F 9/7073; G03F 9/7076; G03F 9/708; G03F 9/7088; G11B 5/855
USPC .................................. 430/20, 296; 360/135
See application file for complete search history.

(56) References Cited

U.S. PATENT DOCUMENTS

| | | | |
|---|---|---|---|
| 7,027,156 B2 | 4/2006 | Watts | |
| 7,136,150 B2 | 11/2006 | Sreenivasan | |
| 7,181,057 B2 | 2/2007 | Adel | |
| 7,713,753 B2 | 5/2010 | Xiao | |
| 7,976,715 B2 | 7/2011 | Dobisz | |
| 8,231,821 B2 | 7/2012 | Choi | |
| 8,257,598 B2 | 9/2012 | Albrecht | |
| 8,268,545 B2 | 9/2012 | Xiao | |
| 8,318,066 B2 | 11/2012 | Sreenivasan | |
| 8,404,432 B2 | 3/2013 | Yang | |
| 8,427,772 B2 | 4/2013 | Lille | |
| 2011/0053088 A1* | 3/2011 | Usa | G03F 7/002 430/296 |
| 2012/0107583 A1 | 5/2012 | Xiao | |
| 2012/0135159 A1 | 5/2012 | Xiao | |
| 2012/0196094 A1 | 8/2012 | Xu | |
| 2012/0273999 A1 | 11/2012 | Chauhan | |
| 2013/0010384 A1 | 1/2013 | Nonaka | |
| 2013/0105437 A1 | 5/2013 | Albrecht | |
| 2013/0186856 A1 | 7/2013 | Xiao | |
| 2014/0287083 A1* | 9/2014 | Gao | G03F 7/0035 425/385 |

FOREIGN PATENT DOCUMENTS

EP          0 921 555        6/1999

OTHER PUBLICATIONS

Malloy et al., "Technology Review and Assessment of Nanoimprint Lithography for Semiconductor and Patterned Media Manufacturing," *Journal of Micro/Nanolithography, MEMS, and MOEMS*, 10(3), (Jul.-Sep. 2011), pp. 032001-1-032001-13.

Yamamoto et al., "Nanoimprint Mold for 2.5 Tbit/in.$^2$ Directed Self-Assembly Bit Patterned Media with Phase Servo Pattern," *Japanese Journal of Applied Physics*, 51 (2012), pp. 046503-1-046503-6.

Schmid et al., "Step and Flash Imprint Lithography for Manufacturing Patterned Media," *J. Vac. Sci. Technol. B.*, 27(2), Mar./Apr. 2009, pp. 573-580.

* cited by examiner

*Primary Examiner* — John A McPherson
(74) *Attorney, Agent, or Firm* — Mueting, Raasch & Gebhardt, P.A.

(57) ABSTRACT

A method is disclosed that includes forming at least one substrate alignment mark and at least one lithography alignment mark in a substrate; forming a seed layer on the substrate; and forming a guide pattern and at least one guide pattern alignment mark in the seed layer, where the at least one guide pattern alignment mark is formed over the at least one substrate alignment mark. The method further includes determining an alignment error of the at least one guide pattern alignment mark relative to the at least one substrate alignment mark; and patterning features on at least one region of the substrate, where the features are positioned on the substrate based on the at least one lithography alignment mark and the alignment error.

12 Claims, 6 Drawing Sheets

BIT PATTERNED MEDIA TEMPLATE INCLUDING ALIGNMENT MARK AND METHOD OF USING SAME

SUMMARY

In general, the present disclosure provides various embodiments of a Bit Patterned Media (BPM) template that includes at least one alignment mark and a method of utilizing such template.

In one aspect, the present disclosure provides a method that includes forming at least one substrate alignment mark and at least one lithography alignment mark in a substrate; forming a seed layer on the substrate; and forming a guide pattern and at least one guide pattern alignment mark in the seed layer, where the at least one guide pattern alignment mark is formed over the at least one substrate alignment mark. The method further includes determining an alignment error of the at least one guide pattern alignment mark relative to the at least one substrate alignment mark; and patterning features on at least one region of the substrate, where the features are positioned on the substrate based on the at least one lithography alignment mark and the alignment error.

In another aspect, the present disclosure provides a bit patterned media (BPM) template that includes a substrate. The substrate includes at least one substrate alignment mark and at least one lithography alignment mark.

These and other aspects of the present disclosure will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION

Figure 1:
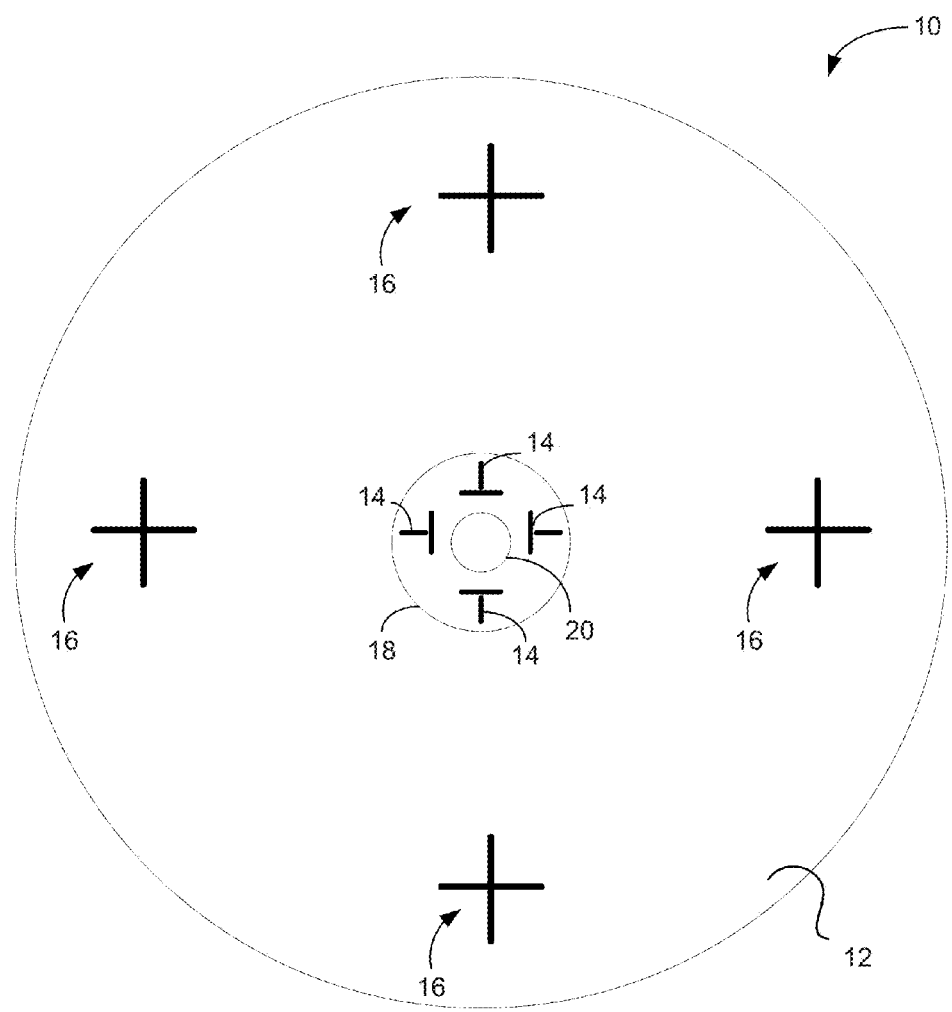
FIG. 1 is a schematic plan view of one embodiment of a Bit Patterned Media template that includes at least one substrate alignment mark.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

In general, the present disclosure provides various embodiments of a Bit Patterned Media (BPM) template that includes at least one alignment mark and a method of utilizing such template.

Bit Pattern Media (BPM) has been extensively explored by the magnetic recording industry as one of several key solutions to expand perpendicular magnetic recording (PMR) technology in high density disk drives (HDDs). A typical BPM media consists of two repeating zones, i.e., a data zone and a servo zone. Data zones can include homogenous dots to store data bits. Servo zones can include dots with various patterns to describe a location and address of information in the data zone. In the servo zone, dots can be arranged into various patterns and spacings to encode information such as head position, timing, and tracking following information for a respective data zone.

The storage capacity of BPM is dependent upon the density of the magnetic islands, or "bits" on the media substrate surface. Current processes for achieving high density patterned media include imprint mold fabrication, nanoimprinting, and pattern transfer into magnetic dots, and the like.

Self-assembling block copolymers (BCP) can enable high-density lithographic bit patterning capability and is a promising material for BPM template fabrication. Directed self-assembly (DSA) combines "top-down" lithography (pre-registered pattern) and "bottom-up" self-assembling materials like block copolymers. Directed self-assembly can generate ultra-high density homogenous patterns.

Various overlay processes can be used to pattern both the data and servo zones of a BPM template. An overlay process typically uses two or more sets of template patterns that, for example, cover an entire surface of a substrate and are divided into individual sections using an alignment scheme and alignment mark settings as further described herein to identify the matching points where the sections were divided. These alignment schemes can enable aligning of these points to position each section accurately relative to the original undivided status position.

Various overlay processes as described herein can include a first protective layer and a second protective layer. The first protective layer can be aligned over servo zones and is used to protect imprinted patterns in the servo zone. The first protective layer protects the servo zone pattern during a process to pattern unprotected data zones with a different areal density. The first protective layer is then removed and the second protective layer is deposited on the data zones. The second protective layer protects the data zone pattern during a process to pattern unprotected servo zones with a different areal density.

In typical overlay processes, e.g., mix-and-match lithography, a contact printer can be used to form data and servo zone features in a substrate. Such contact printers, however, typically exhibit an alignment error of 1-2 microns. Instead of using a contact printer, lithographic patterning of these features can be performed using suitable X-Y laser or ebeam systems that directly write features to a substrate. Such systems can, in some embodiments, have an error of less than 50 nm. These systems, however, can only see overlay alignment marks that are quite deep in the substrate. For example, a 100 Kev ebeam system may only be able to see alignment marks that are at least 500 nm deep.

With a typical BCP DSA process, a guide pattern template can be imprinted in a seed layer on a substrate. Any features and alignment marks imprinted into the seed layer can be no greater than, in some embodiments, 60 nm in depth because the seed layers are typically quite thin. These alignment marks would, therefore, be too shallow for an ebeam lithography system to read. If the imprinted guide pattern is not aligned with imprint alignment marks formed on the substrate, then the ebeam system will pattern features that are not aligned with the guide pattern as the device can only see the deeper lithography alignment marks formed in the substrate.

In some embodiments of the present disclosure, at least one substrate alignment mark is formed in a substrate. At least one lithography alignment mark is also formed in the substrate. After formation of a seed layer on the substrate, a guide pattern and at least one guide pattern alignment mark are formed in the seed layer, where the at least one guide pattern alignment mark is formed over the at least one substrate alignment mark. An alignment error of the at least one guide pattern alignment mark relative to the at least one substrate alignment mark can be determined and used in subsequent lithographic processing to properly align the patterning of features with the guide pattern that was imprinted in the seed layer. For example, in some embodiments, laser or ebeam X-Y direct writing systems can expose an overlay formed on the guide pattern based on the alignment error and the lithography alignment marks that were formed in the substrate.

Any suitable templates can be used to form BPM. For example, FIG. 1 is a schematic plan view of one embodiment of a bit patterned media template 10. The bit patterned media template 10 includes a substrate 12 and at least one substrate alignment mark 14. The template 10 also includes at least one lithography alignment mark 16.

The substrate 12 can include any suitable material or materials. In some embodiments, the substrate 12 can include quartz, silicon, etc. In some embodiments, the substrate 12 can include any suitable materials that can be used in a block copolymer process as is further described herein.

In some embodiments, an optional thin film layer (not shown) can be formed on the substrate 12 to provide a hard mask. Any suitable material or materials can be utilized to form the hard mask on the substrate 12, e.g., chromium, silicon, or carbon, and similar conductive, semiconductive, or insulative thin film layers.

As illustrated in FIG. 1, the at least one substrate alignment mark 14 is formed in the substrate 12. Although the template 10 of FIG. 1 includes four substrate alignment marks 14, any suitable number of substrate alignment marks 14 can be formed in the substrate 12. The alignment marks 14 can be formed in any suitable region or portion of the substrate 12. For example, as illustrated in FIG. 1, the alignment marks 14 are formed proximate a central region of the substrate 12. In other embodiments, the alignment marks 14 can be formed proximate an outer region of the substrate 12.

Any suitable technique can be utilized to form the alignment marks 14. In some embodiments, the alignment marks 14 can be etched into the substrate 12 using any suitable etching technique, e.g., reactive ion etching, ion beam etching, etc. In some embodiments, a photoresist layer is formed on the substrate 12, and a mask is used to pattern the alignment marks 14 into the photoresist. The alignment marks 14 are then etched into the substrate 12. The photoresist is then removed from the surface of the substrate 12.

The alignment marks 14 can be formed in the substrate 12 at any suitable depth such that lithographic techniques described herein can detect the alignment marks 14. In some embodiments, the alignment marks 14 are formed in the substrate 12 at a depth of at least 100 nm, at least 200 nm, at least 300 nm, at least 400 nm, at least 500 nm. In other embodiments, the alignment marks are formed in the substrate at a depth of no greater than 1000 nm.

In some embodiments, the alignment marks 14 are formed on the substrate 12 instead of in the substrate. Any suitable technique can be utilized to form the alignment marks 14 on the substrate. In such embodiments, the alignment marks 14 can be formed using a material that is detectable using a suitable lithographic process, e.g., liftoff, deposition.

The alignment marks 14 can include any suitable shape or shapes. In some embodiments, the alignment marks 14 can take any suitable polygonal shape, e.g., square, rectangular, etc. In other embodiments, the alignment marks 14 can take the shape of a cross. In some embodiments, the alignment marks 14 can include one or more verniers as is further described herein.

The alignment marks 14 can include a single mark or a combination of two or more marks. For example, in some embodiments, each alignment mark 14 can include a mark that is aligned with a radial line from a center of the substrate 12 to an edge of the substrate, and a mark that is transverse to this radial line as is further described herein.

Further, the alignment marks 14 can be any suitable size and dimension such that they can be observed or detected using any suitable lithographic process. In some embodiments, the alignment marks 14 are equal in size. In other embodiments, one or more alignment marks 14 are of a different size than the other alignment marks.

In addition to alignment marks 14, at least one lithography alignment mark 16 can be formed on or in the substrate 12. Any suitable technique can be used to form the at least one lithography alignment mark 16, e.g., the same techniques used to form the substrate alignment marks 14. Although the embodiment illustrated in FIG. 1 includes four lithography alignment marks 16, any suitable number of lithography alignment marks 16 can be formed. Further, the lithography alignment marks 16 can take any suitable shape or combination of shapes, e.g., the same shapes described regarding the substrate alignment marks 14.

In some embodiments, the lithography alignment marks 16 are aligned along a radial line from the center to the edge of the substrate 12. In some embodiments, the lithography alignment marks 16 are aligned with the substrate alignment marks 14 along a radial line or radius of the substrate 12. In other embodiments, the lithography alignment marks 16 and the substrate alignment marks 14 are not aligned.

The lithography alignment marks 16 can be utilized to guide suitable lithographic processes to form features in the substrate as is further described herein.

In some embodiments, the substrate 12 can also include at least one imprint alignment mark 18, 20. Any suitable number of imprint alignment marks 18, 20 can be included on or in the substrate 12. The imprint alignment marks 18, 20 can be utilized to guide the imprinting of a guide pattern in a seed layer formed on the substrate 12 as is further described herein. Further, the imprint alignment marks 18, 20 can be any suitable size and take any suitable shape.

Figure 3A:
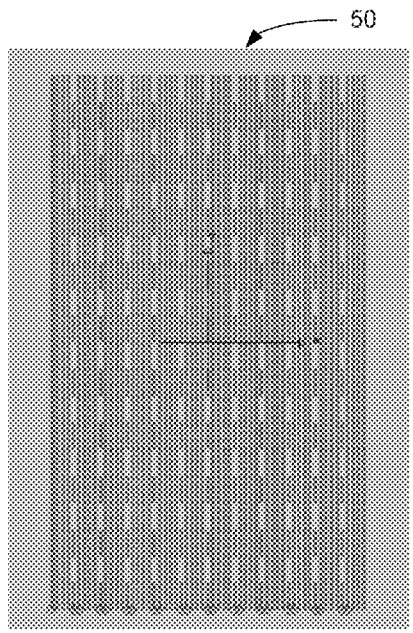
FIGS. 3A-B are micrographs of one embodiment of a substrate alignment mark that includes first and second verniers.
Figure 3B:
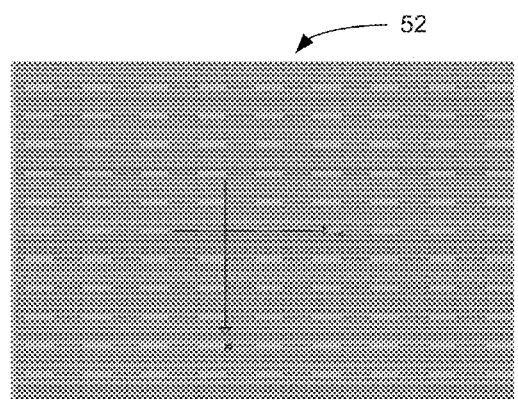

As mentioned herein, the substrate alignment marks 14 can take any suitable shape. For example, FIGS. 3A-B are micrographs of one embodiment of verniers that were formed in a substrate and that can be utilized for the substrate alignment marks 14 of the template 10 of FIG. 1. FIG. 3A depicts a first vernier 50 and FIG. 3B depicts a second vernier 52. The first vernier 50 and second vernier 52 can include any suitable pattern. As illustrated, the first and second verniers 50, 52 include a series of lines that repeat in a direction transverse to the lines to form a repeating pattern. The repeating pattern can have any suitable pitch between lines. For example, in some embodiments, the pattern can have a pitch of at least 2 microns, at least 2.05 microns, at least 2.1 microns. In some embodiments, the pattern can have a pitch no greater than 2.5 microns.

The first vernier 50 and second vernier 52 can include the same pattern or different patterns. In some embodiments, the first vernier 50 and second vernier 52 each have the same pattern, but the first vernier includes a first pitch and the second vernier includes a second pitch that is different from the first pitch.

In some embodiments, one or more of the substrate alignment marks 14 can include the first vernier 50 and the second vernier 52. As illustrated in FIGS. 3A-B, the second vernier 52 is transverse to the first vernier 50. For example, one or more of the substrate alignment marks 14 of BPM template 10 can include a first vernier and a second vernier transverse to the first vernier.

Figure 2:
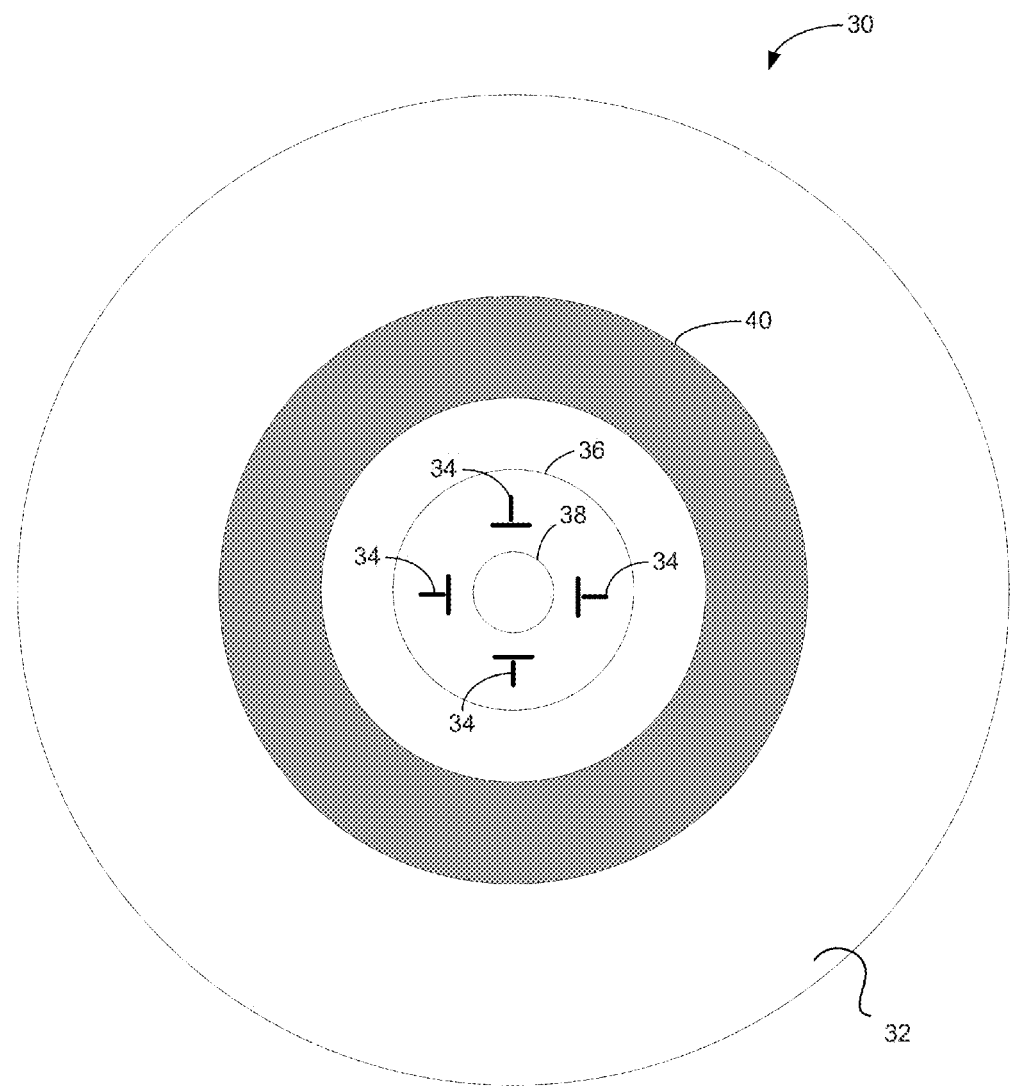
FIG. 2 is a schematic plan view of one embodiment of a guide pattern template that includes at least one guide pattern alignment mark.

The overlay processes described herein can utilize any suitable template, e.g., BPM template 10 of FIG. 1. These processes can also include any suitable guide pattern that can be formed on the templates described herein. For example, FIG. 2 is a schematic plan view of a guide pattern template 30. In some embodiments, the guide pattern template 30 is formed on a BPM template, e.g., BPM template 10 of FIG. 1. The template 30 will be described in reference to the BPM template 10 of FIG. 1.

The guide pattern template 30 includes a seed layer 32 that is formed on the substrate 12 of the BPM template 10. The seed layer 32 can include any suitable material or materials for forming one or more guide patterns, e.g., organic or polymeric resist materials.

In some embodiments, the seed layer 32 includes at least one guide pattern alignment mark 34. In some embodiments, the at least one guide pattern alignment mark 34 can be positioned on or in the seed layer 32 such that it is over or coincident with one or more of the substrate alignment marks 14. In some embodiments, the at least one guide pattern alignment mark 34 is positioned in this matter such that an alignment error between a guide pattern 40 formed on or in the seed layer 32 and the BPM template 10 can be determined as is further described herein.

Figure 4A:
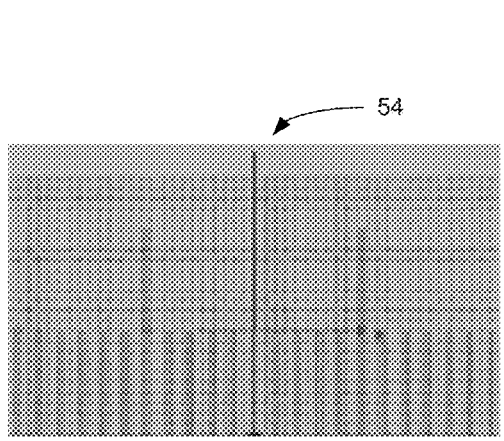
FIGS. 4A-B are micrographs of one embodiment of a guide pattern alignment mark that includes first and second verniers.
Figure 4B:
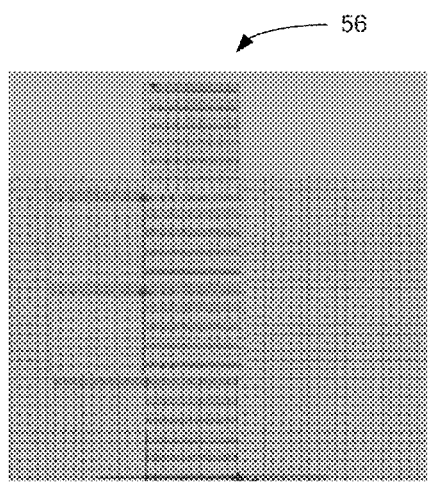

As illustrated in FIG. 2, the overlay template 30 includes four guide pattern alignment marks 34; however, the template can include any suitable number of guide pattern alignment marks. The guide pattern alignment marks 34 can include any suitable shape or shapes, e.g., the shapes described regarding substrate alignment marks 14. For example, FIGS. 4A-B are micrographs of one embodiment of verniers that were formed in a seed layer as part of a guide pattern template. FIG. 4A shows a first vernier 54 of a guide pattern alignment mark, and FIG. 4B shows a second vernier 56 of the guide pattern alignment mark. In the embodiment shown in FIGS. 4A-B the first and second verniers 54, 56 include the same pattern. Further, as shown, the second vernier 56 is transverse to the first vernier 54.

In the example guide pattern template that was formed, the first vernier 54 of the guide pattern template in FIG. 4A was positioned over the first vernier 50 of the BPM template shown in FIG. 3A, and the second vernier 56 of the guide pattern template shown in FIG. 4B was positioned over the second vernier 52 of the BPM template shown in FIG. 3B. As can be seen in these figures, the first vernier 50 of the BPM template includes a pattern that is different from the first vernier 54 of the guide pattern template, and the second vernier 52 of the BPM template has a pattern that is different from the pattern of the second vernier 56 of the guide pattern template.

In some embodiments, the at least one guide pattern alignment mark 34 can include the same pattern as the at least one substrate alignment mark 14 over which it is formed. In other embodiments, the at least one guide pattern alignment mark 34 can include a pattern different from the pattern of the at least one substrate alignment mark 14 over which it is formed. In embodiments that utilize rotational lithographic patterning, the guide pattern alignment marks 34 can include one or more verniers that include fewer repeating patterns than the verniers of the substrate alignment marks 14.

Further, in embodiments where associated guide pattern alignment marks 34 and substrate alignment marks 14 include the same pattern, the pattern of the guide pattern alignment mark can have a first pitch, and the pattern of the substrate alignment mark pattern can have a second pitch that is the same as or different from the first pitch.

In some embodiments, the at least one substrate alignment mark 14 of the BPM template 10 includes a first vernier and a second vernier transverse to the first vernier, and the at least one guide pattern alignment mark 34 includes a first vernier and a second vernier transverse to the first vernier. In some embodiments, the first vernier of the at least one guide pattern alignment mark 34 is aligned with the first vernier of the at least one substrate alignment mark 14, and the second vernier of the at least one guide pattern alignment mark is aligned with the second vernier of the at least one substrate alignment mark.

The guide pattern template 30 also includes imprint alignment marks 36, 38 that are used to align the guide pattern with the imprint alignment marks 18, 20 of the BPM template 10. The imprint alignment marks 36, 38 can include any suitable shapes or patterns to guide the imprinting of the guide pattern into or on the template 30.

The seed layer 32 also includes a guide pattern 40 that in some embodiments includes one or more servo zones and one or more data zones as is further described herein. In some embodiments, the servo zone includes servo zone features and the data zone includes data zone features. The servo and data zone features can be utilized to guide DSA patterning as is further described herein.

Any suitable technique or techniques can be used to form the guide pattern template 30. In some embodiments, one or both of the guide pattern 40 and at least one guide pattern alignment mark 34 can be formed in the seed layer 32, and the seed layer can then be imprinted into template 30. Any suitable technique or techniques can be utilized to form the guide pattern 40 and the at least one guide pattern alignment mark 34 in the seed layer 32.

The at least one guide pattern alignment mark 34 and the at least one substrate alignment mark 14 can be utilized to determine an alignment error between the substrate 12 and the guide pattern template 30.

Figure 5:
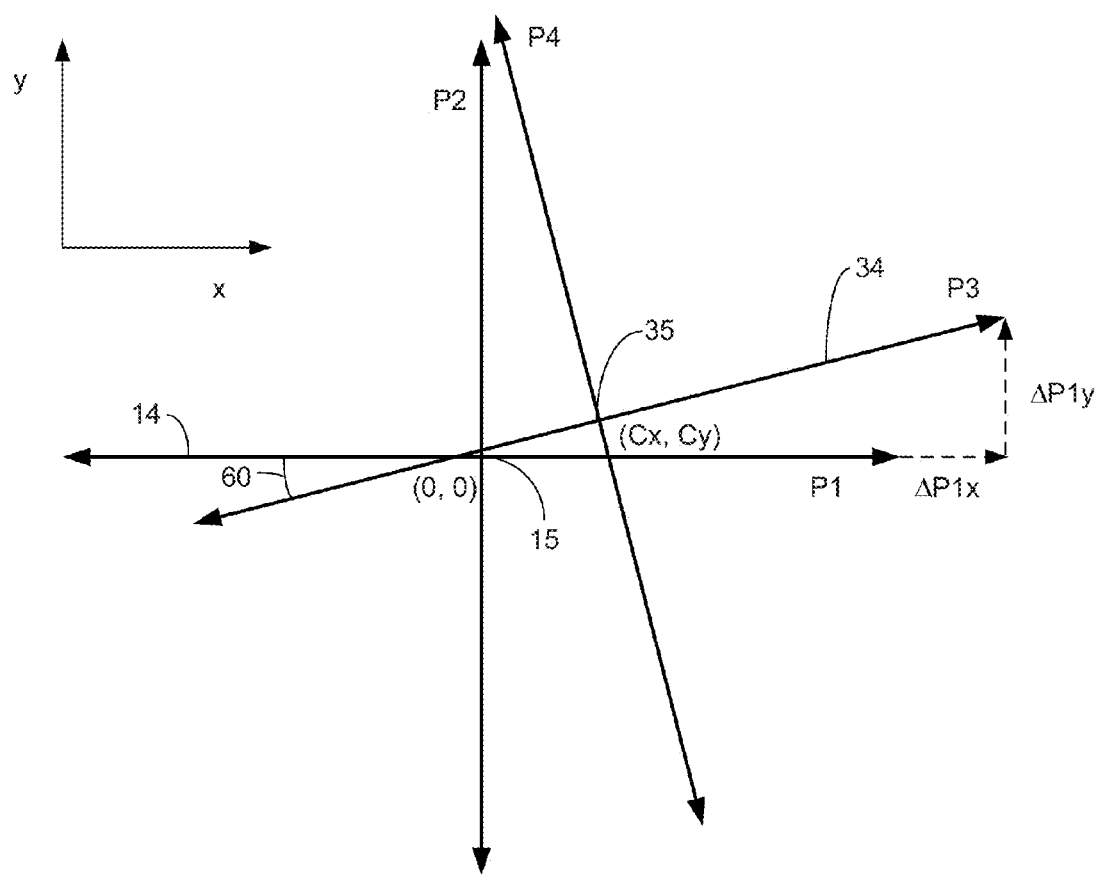
FIG. 5 is a schematic diagram of guide pattern alignment mark formed over a substrate alignment mark.

Further, any suitable technique can be utilized to determine the alignment error. For example, FIG. 5 illustrates one technique for determining alignment error in reference to the BPM template 10 and the guide pattern template 30 of FIGS. 1-2. In FIG. 5, the at least one guide pattern alignment mark 34 is formed over the at least one substrate alignment mark 14. In this embodiment, the at least one guide pattern alignment mark 34 is translationally and rotationally displaced from the at least one substrate alignment mark 14.

The alignment error can be determined by measuring a distance in an x-direction in a plane substantially parallel to the substrate 12 between a center 15 of the at least one substrate alignment mark 14 and a center 35 of the at least one guide pattern alignment mark 34. Any suitable technique can be used to determine this distance. A distance in a y-direction substantially orthogonal to the x-direction and in the same plane as the x-direction between the center 15 of the at least one substrate alignment mark 14 and the center 35 of the at least one guide pattern alignment mark 34 can also be determined using any suitable technique. Further, an angle of rotation 60 between the at least one substrate alignment mark 14 and the at least one guide pattern alignment mark 34 can also be determined.

For example, in an exemplary embodiment, Cx, Cy, and θ can be calculated using the following equations:

$$Cx = (\Delta P1x + \Delta P3x)/2 = (\Delta P2x + \Delta P4x)/2 = (\Delta P1x + \Delta P3x + \Delta P2x + \Delta P4x)/4$$

$$Cy = (\Delta P1y + \Delta P3y)/2 = (\Delta P2y + \Delta P4y)/2 = (\Delta P1y + \Delta P3y + \Delta P2y + \Delta P4y)/4$$

$$R \sin(\theta) = (\Delta P1y - \Delta P3y)/2$$

$$R \sin(\theta) = (\Delta P4x - \Delta P2x)/2$$

$$R \cos(\theta) = R + (\Delta P1x - \Delta P3x)/2$$

$$R \cos(\theta) = R + (\Delta P2y - \Delta P4y)/2.$$

(Cx, Cy) are the coordinates of the center 35 of the at least one guide pattern alignment mark 34 relative to a coordinate system where (0, 0) is set as the center 15 of the at least one substrate alignment mark 14. P1, P2 are the x and y axes for the coordinate system for the at least one substrate alignment mark 14. And P3, P4 are the x and y axes for the coordinate system for the at least one guide pattern alignment mark 34.

Figure 6A:
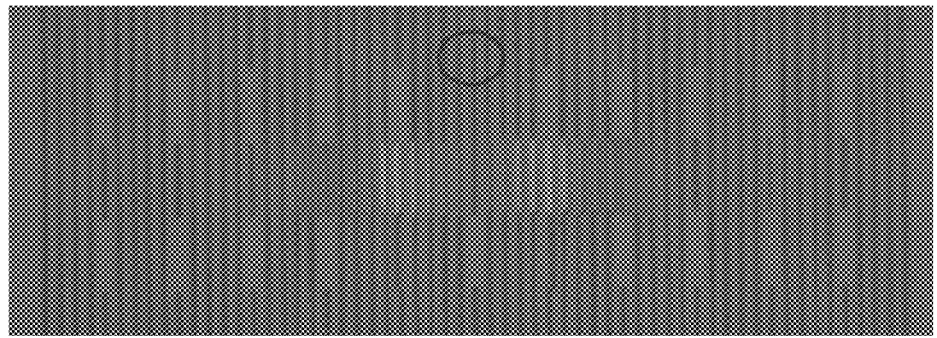
FIGS. 6A-B are micrographs of the first vernier of FIG. 4A formed over the first vernier of FIG. 3A.
Figure 6B:
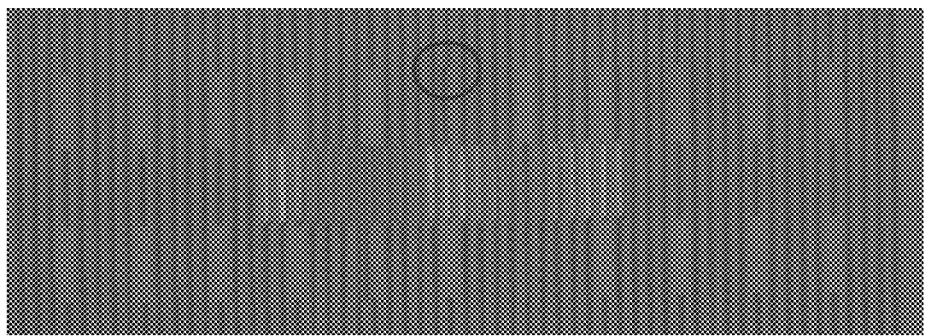

For example, FIGS. 6A-B are micrographs of the first vernier 54 of FIG. 4A formed over the first vernier 50 of FIG. 3A. The first vernier 54 was formed as a guide pattern alignment mark of a guide pattern template that was formed in a seed layer on a BPM template. The BPM template included the first vernier 50 as part of the substrate alignment mark. In FIG. 6A, the first vernier 54 of the guide pattern alignment mark is aligned with the first vernier of the substrate alignment mark such that there is no alignment error. In FIG. 6B, the verniers are slightly misaligned such that the alignment error includes a 0.5 micron offset.

The alignment error can then be used to reposition any subsequent lithographic patterning such that patterned features are aligned with the guide pattern template 30.

Figure 7A:
FIGS. 7A-F are schematic cross-section views of a method of forming a Bit Patterned Media template.

The alignment techniques described herein can be used with any suitable overlay patterning process. For example, FIGS. 7A-F are schematic cross-section views of one embodiment of a method of forming a BPM template using an exemplary overlay process that utilizes DSA to form servo and data zones on a substrate of the BPM template (e.g., template 10 of FIG. 1). In FIG. 7A, at least one substrate alignment mark 72 and at least one lithography alignment mark 74 are formed in a substrate 70. In some embodiments, an optional hard mask (not shown) can be formed on the substrate 70 and alignment marks 72, 74. Any suitable material or materials can be included in the optional hard mask, e.g., a thin chromium layer.

Figure 7B:
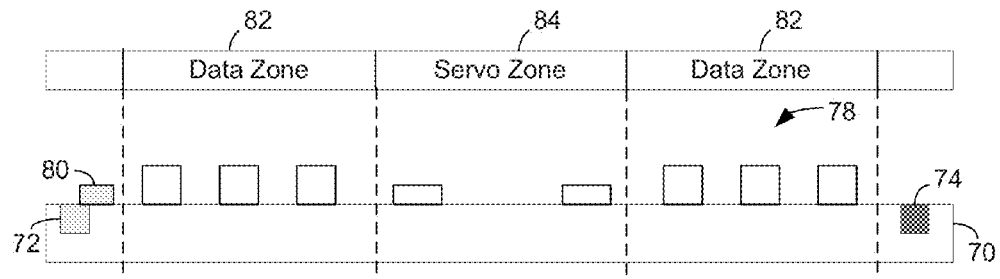

A seed layer (not shown) is formed on the substrate 70, and a guide pattern 78 and at least one guide pattern alignment mark 80 can be formed in the seed layer as shown in FIG. 7B. The guide pattern 78 includes both data zone 82 and servo zone 84 patterns. Although two data zones 82 and one servo zone 84 are shown, any suitable number of data zones and servo zones can be patterned in the seed layer. The at least one guide pattern alignment mark 80 is formed over the at least one substrate alignment mark 72. In some embodiments, an optional thin chromium (Cr) film (not shown) can then be formed on the guide pattern 78 and/or guide pattern alignment mark 80.

Figure 7C:
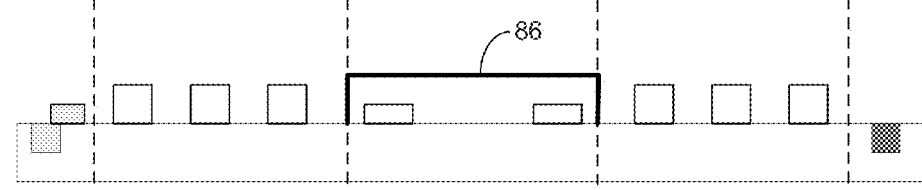

In FIG. 7C, a first protective layer 86 is formed on the servo zone 84 of the substrate 70. And a dry etch to remove the optional Cr layer from the data zones 86 is performed to open up these zones for further processing. A process using, e.g., oxygen plasma can be performed to remove the first protective layer 86 over the servo zone 84.

Prior to forming features in the substrate 70 using the guide pattern 78, an alignment error of the at least one guide pattern alignment mark 80 relative to the at least one substrate alignment mark 72 can be determined using any suitable technique, e.g., the techniques described herein. Features can then be patterned on at least one region of the substrate 70. These features can be positioned on the substrate 70 based on the at least one lithography alignment mark 74 and the alignment error.

Figure 7D:
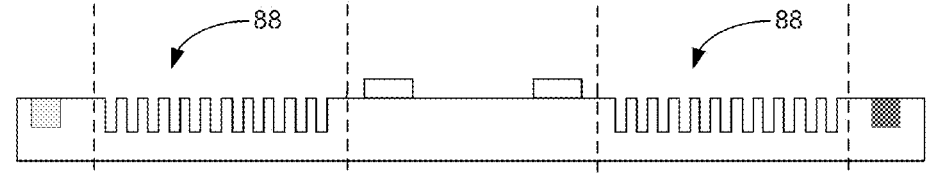

Any suitable technique can be used to form features on at least one region of the substrate. For example, a data zone first block copolymer directed self-assembly process can be used to form features 88 in the substrate 70 as shown in FIG. 7D. Any suitable technique can be used to form these features, e.g., the techniques described in U.S. patent application Ser. No. 13/798,087 to Xiao et al., entitled METHOD OF FABRICATING SERVO INTEGRATED TEMPLATE. In general, a DSA process can be used to increase an areal density of the features formed in the data zones 82. In some embodiments, a block copolymer (BCP) material can be deposited on the guide pattern 78. The BCP is annealed, and at least a portion of the annealed BCP is removed to form features on the at least one region of the substrate 70. These features can be used as a mask to transfer the features 88 into the substrate 70 using any suitable etching technique.

Figure 7E:
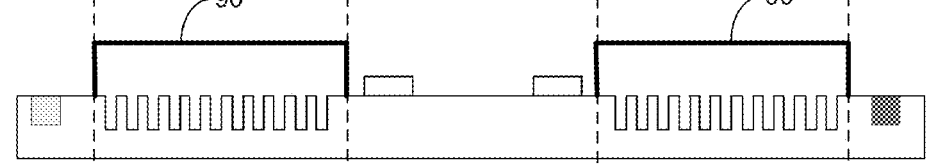

Although not shown, a mask layer can be formed over the data zone features 88. A second protective layer 90 is formed on the etched data zones 82 as shown in FIG. 7E.

Figure 7F:
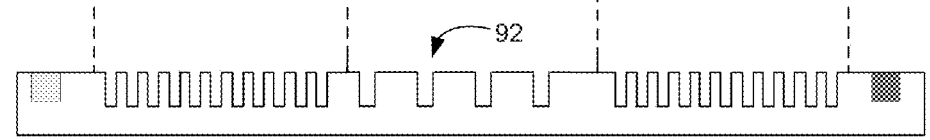

In FIG. 7F, a second DSA technique can be used in the servo zone 84 to pattern features 92 on the servo zone 84. The features 92 are then transferred into the substrate 70 using any suitable technique. The second protective layer 90 is removed from the data zones 82 to provide a BPM template for further processing.

The BPM templates and processes of the present disclosure can be part of a BPM media fabrication process. The embodiments described herein can, for example, be applied to any fabrication process featuring large-area high-density nano-patterning with long-range lateral ordering, such as patterning magnetic film layers in storage media, semiconductor production, and the like. Further, the embodiments, described herein can be used to fabricate a template for use as a mask, thereby facilitating the deposition of functional materials or other additive processes. Further, the embodiments of the present disclosure can be used to facilitate the etching of functional materials, to directly or indirectly form a pattern on storage media, or other subtractive processes.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. A method, comprising:
    forming at least one substrate alignment mark and at least one lithography alignment mark in a substrate;
    forming a seed layer on the substrate;
    forming a guide pattern and at least one guide pattern alignment mark in the seed layer, wherein the at least one guide pattern alignment mark is formed over the at least one substrate alignment mark;
    determining an alignment error of the at least one guide pattern alignment mark relative to the at least one substrate alignment mark; and
    patterning features on at least one region of the substrate, wherein the features are positioned on the substrate based on the at least one lithography alignment mark and the alignment error.

2. The method of claim 1, wherein patterning features on the at least one region of the substrate comprises:
    depositing a first protective layer on a servo zone of the substrate; and
    patterning features on a data zone of the substrate.

3. The method of claim 2, further comprising transferring the data zone features into the substrate.

4. The method of claim 3, wherein patterning features on the at least one region of the substrate further comprises:
    depositing a second protective layer on the patterned data zone;
    removing the first protective layer from the servo zone;
    patterning features on the servo zone; and
    removing the second protective layer from the patterned data zone.

5. The method of claim 4, further comprising transferring the servo zone features into the substrate.

6. The method of claim 1, wherein the at least one substrate alignment mark comprises a first vernier and a second vernier transverse to the first vernier.

7. The method of claim 6, wherein the at least one guide pattern alignment mark comprises a first vernier and a second vernier transverse to the first vernier.

8. The method of claim 7, wherein each of the first and second verniers of the at least one substrate alignment mark comprises a first pitch, and each of the first and second verniers of the at least one guide pattern alignment mark comprises a second pitch, wherein the first pitch is different from the second pitch.

9. The method of claim 1, wherein determining the alignment error comprises:
    measuring a distance in an x-direction in a plane substantially parallel to the substrate between a center of the at least one substrate alignment mark and a center of the at least one guide pattern alignment mark;
    measuring a distance in a y-direction substantially transverse to the x-direction and in the same plane as the x-direction between the center of the at least one substrate alignment mark and the center of the at least one guide pattern alignment mark; and
    measuring an angle of rotation between the at least one substrate alignment mark and the at least one guide pattern alignment mark.

10. The method of claim 1, wherein forming the at least one substrate alignment mark and the at least one lithography alignment mark in the substrate comprises etching the at least one substrate alignment mark and the at least one lithography alignment mark into the substrate.

11. The method of claim 1, wherein forming the guide pattern and the at least one guide pattern alignment mark comprises imprinting the guide pattern and the at least one guide pattern alignment mark into the substrate.

12. The method of claim 1, wherein patterning features on the at least one region of the substrate comprises:
    depositing a block copolymer ("BCP") material on the guide pattern;
    annealing the deposited BCP; and
    removing at least a portion of the annealed BCP to form features on the at least one region of the substrate.

* * * * *